(12) United States Patent
Kikuchi

(10) Patent No.: US 12,087,721 B2
(45) Date of Patent: Sep. 10, 2024

(54) ELECTRONIC DEVICE AND METHOD FOR MANUFACTURING ELECTRONIC DEVICE

(71) Applicant: KYOCERA Corporation, Kyoto (JP)

(72) Inventor: Tomonao Kikuchi, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 454 days.

(21) Appl. No.: 17/622,256

(22) PCT Filed: Jun. 10, 2020

(86) PCT No.: PCT/JP2020/022837
§ 371 (c)(1),
(2) Date: Dec. 23, 2021

(87) PCT Pub. No.: WO2020/261993
PCT Pub. Date: Dec. 30, 2020

(65) Prior Publication Data
US 2022/0254748 A1    Aug. 11, 2022

(30) Foreign Application Priority Data

Jun. 27, 2019    (JP) ................. 2019-120133

(51) Int. Cl.
*H01L 23/00*    (2006.01)
*B22F 7/06*    (2006.01)
(Continued)

(52) U.S. Cl.
CPC .............. *H01L 24/29* (2013.01); *F21S 8/085* (2013.01); *F21S 41/141* (2018.01); *F21S 43/14* (2018.01);
(Continued)

(58) Field of Classification Search
CPC ......... H01L 24/29; H01L 24/27; H01L 24/83; H01L 33/48; H01L 33/62; H01L 2224/29147; H01L 2224/2957; H01L 2224/29647; H01L 2224/83951; H01L 21/563; H01L 24/03; H01L 33/44; H01L 21/50; H01L 2224/2902; H01L 2224/8384; H01L 2224/29562; H01L 2224/29687; H01L 24/32; H01L 2224/83948; F21S 8/085; F21S 41/141; F21S 43/14;
(Continued)

(56) References Cited

U.S. PATENT DOCUMENTS

| | | | |
|---|---|---|---|
| 2009/0096100 A1* | 4/2009 | Kajiwara | ............... H01L 24/29 |
| | | | 252/512 |
| 2016/0197351 A1 | 7/2016 | Tani et al. | |
| 2018/0269074 A1* | 9/2018 | Kamikoriyama | ....... H01L 24/28 |

FOREIGN PATENT DOCUMENTS

| | | |
|---|---|---|
| JP | 2007-067452 A | 3/2007 |
| JP | 2014-054653 A | 3/2014 |
| JP | 2017-075334 A | 4/2017 |

* cited by examiner

*Primary Examiner* — Farun Lu
(74) *Attorney, Agent, or Firm* — Volpe Koenig

(57) ABSTRACT

An electronic device characterized by including a substrate, a bonding layer provided on the substrate, the bonding layer containing copper in an amount of greater than 0 mass % but 60 mass % or less, the copper having its crystal grain size of 50 nm or less, an electronic component provided on the bonding layer, and a coating film covering a side of the bonding layer, the coating film containing at least one compound selected from copper (I) oxide ($Cu_2O$) and copper (II) oxide (CuO).

8 Claims, 1 Drawing Sheet

(51) Int. Cl.
  *F21S 8/08* (2006.01)
  *F21S 41/141* (2018.01)
  *F21S 43/14* (2018.01)
  *F21Y 115/10* (2016.01)
  *H01L 33/48* (2010.01)
  *H01L 33/62* (2010.01)

(52) U.S. Cl.
  CPC .............. *H01L 24/12* (2013.01); *H01L 24/27* (2013.01); *H01L 24/83* (2013.01); *H01L 33/48* (2013.01); *H01L 33/62* (2013.01); *B22F 7/064* (2013.01); *F21Y 2115/10* (2016.08); *H01L 2224/29147* (2013.01); *H01L 2224/2957* (2013.01); *H01L 2224/29647* (2013.01); *H01L 2224/83951* (2013.01)

(58) Field of Classification Search
  CPC ........ B22F 7/064; B22F 2998/10; B22F 7/08; B22F 3/24; F21Y 2115/10; B23K 35/025; B23K 35/302; F21W 2131/103; F21K 9/90
  See application file for complete search history.

ELECTRONIC DEVICE AND METHOD FOR MANUFACTURING ELECTRONIC DEVICE

TECHNICAL FIELD

The present disclosure relates to an electronic device and a method for manufacturing an electronic device.

BACKGROUND ART

In electronic devices, such as LED lights, methods for bonding a light emitting element and a package while maintaining conductivity have been used, and such a method includes bonding by using a silver paste containing a large amount of organic resins, such as an epoxy resin and a silicone resin (hereinafter referred to as a silver paste) (see, e.g., Patent Document 1).

In addition, when a more reliable bonding layer is desired for a similar purpose, gold-tin pastes, which have excellent thermal conductivity and bonding strength, have been used (see, e.g., Patent Document 2).

In recent years, silver sintering pastes obtained by using sintering silver particles have been proposed (see, e.g., Patent Document 3). The silver sintering pastes are inexpensive compared to gold-tin pastes, having excellent thermal conductivity and bonding reliability, and thus are expected to be used as alternatives to the gold-tin pastes.

On the other hand, in the field of automotive LEDs, sulfurization resistance properties are mandatory requirements in the related art. This is because LEDs are exposed to an exhaust gas ($SO_2$) or combustion gases ($SO_2$, $H_2S$), and sulfurization resistance properties of bonding materials, such as silver pastes, have been evaluated in accordance with standardized sulfurization testing methods, such as JIS C 60068-2-42(1993), JIS C 60068-2-43(1993), and JIS C 60068-2-60(2018).

For example, in the aforementioned sulfurization tests, silver pastes have exhibited an increase in thermal resistance and a decrease in bonding reliability due to the sulfurization of silver but in some cases, the silver pastes managed to have satisfied customer requirements depending on the resin component content.

However, a recent demand for sulfurization resistance has been further increased, and marginal tests using sulfur powder (hereinafter referred to as a sulfur gas ($S_8$) test) are required in the field of automotive LEDs. This has created enormous difficulties for silver pastes to withstand the sulfurization tests, and such a tendency is even more pronounced for silver sintering pastes containing a small amount of resin components.

CITATION LIST

Patent Literature

Patent Document 1: JP 2007-67452 A
Patent Document 2: JP 2014-54653 A
Patent Document 3: JP 2017-75334 A

SUMMARY OF INVENTION

Technical Problem

Silver is highly corrosive to sulfur, and thus electronic devices manufactured using a silver paste as a bonding material cannot withstand the sulfur gas ($S_8$) test. In addition, copper is generally less corrosive to sulfur than silver is, and thus using a copper paste containing copper powder as a bonding material is also conceivable. However, even electronic devices manufactured using a copper paste as a bonding material do not have sufficient resistance to the sulfur gas ($S_8$) test.

The present disclosure has been made in view of such circumstances, and an object of the present disclosure is to provide an electronic device having excellent sulfur resistance and a method for manufacturing the electronic device.

Solution to Problem

As a result of diligent studies to solve the problems described above, the present inventor has found that the above problem can be solved by a bonding layer containing a specific amount of copper having its crystal grain size of 50 nm or less, and forming a coating film containing copper oxide to cover a side of the bonding layer.

The present disclosure has been completed based on such a finding.

Namely, the present disclosure relates to the following.

(1) An electronic device characterized by including a substrate, a bonding layer provided on the substrate, the bonding layer containing copper in an amount of greater than 0 mass % but 60 mass % or less, the copper having its crystal grain size of 50 nm or less, an electronic component provided on the bonding layer, and a coating film covering a side of the bonding layer, the coating film containing at least one compound selected from copper (I) oxide ($Cu_2O$) and copper (II) oxide (CuO).

(2) The electronic device according to (1), wherein the bonding layer includes a fillet extending laterally beyond a side edge of the electronic component, and wherein the coating film covers the fillet.

(3) The electronic device according to (1) or (2) described above, characterized in that, when the coating film has a thickness of A nm and a proportion of the copper (I) oxide ($Cu_2O$) content present in copper oxides contained in the coating film is B mass %, the following relationship (1) is found for A and B:

$$A \geq 10, B \geq 20 \tag{1}$$

(4) The electronic device according to (3) described above, characterized in that, when the coating film has a thickness of A nm and a proportion of the copper (I) oxide ($Cu_2O$) content present in copper oxides contained in the coating film is B mass %, the following relationship (2) is found for A and B:

$$B \geq 1.15 \times A^{-0.2} \times 100 \tag{2}$$

(5) The electronic device according to any of (1) to (4) described above, characterized in that the electronic component is an optical semiconductor device.

(6) An automotive lamp including the electronic device described in any of (1) to (5) described above.

(7) A streetlight including the electronic device described in any of (1) to (5) described above.

(8) A method for manufacturing an electronic device, the method including: firing a substrate including an electronic component disposed over a copper paste at 125 to 250° C. for 30 minutes to 10 hours in a reducing atmosphere, so as to bond the substrate and the electronic component via a bonding layer containing copper; and oxidizing a side of the bonding layer by heating the substrate at 150 to 250° C. for 3 minutes to 10 hours in an oxygen-containing atmosphere, so as to form a coating film containing at least one compound selected from copper (I) oxide ($Cu_2O$) and copper (II) oxide (CuO).

Advantageous Effects of Invention

The present disclosure provided an electronic device having excellent sulfur resistance and the method for manufacturing such an electronic device.

DESCRIPTION OF EMBODIMENTS

Hereinafter, the present disclosure will be described in detail with reference to an embodiments below.

Electronic Device

An electronic device according to the present embodiment includes:

a substrate;

a bonding layer provided on the substrate, the bonding layer containing copper in an amount of greater than 0 mass % but 60 mass % or less, the copper having its crystal grain size of 50 nm or less;

an electronic component provided on the bonding layer; and a coating film covering a side of the bonding layer, the coating film containing at least one compound selected from copper (I) oxide ($Cu_2O$) and copper (II) oxide (CuO).

Figure 1:
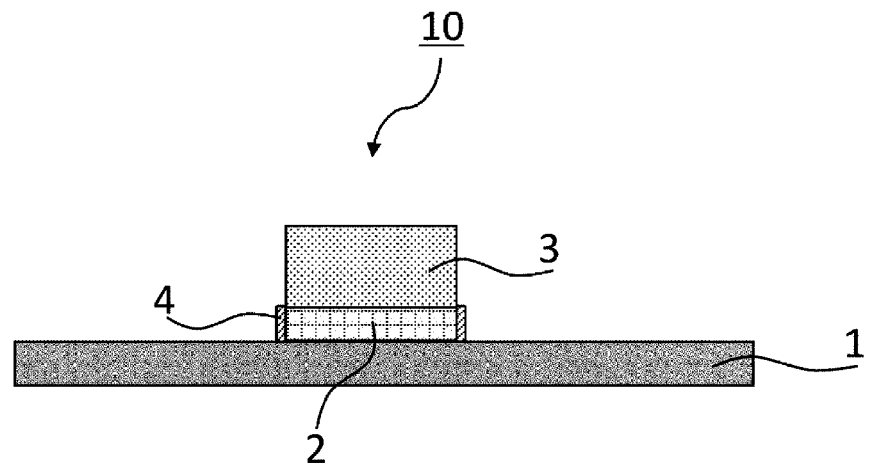
FIG. 1 is a cross-sectional view illustrating an overall configuration of an embodiment of an electronic device of the present disclosure.
Figure 2:
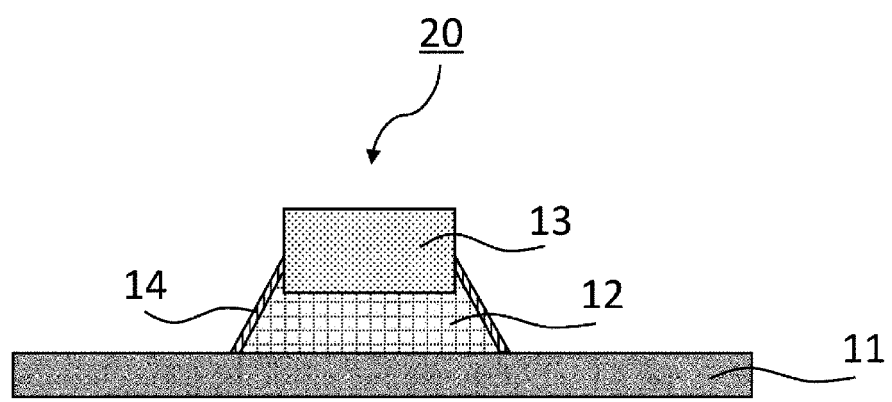
FIG. 2 is a cross-sectional view illustrating an overall configuration of an embodiment of an electronic device of the present disclosure.

FIG. 1 and FIG. 2 are cross-sectional views each illustrating an overall configuration of an electronic device according to an embodiment of the present disclosure. As illustrated in FIG. 1, an electronic device 10 of the present disclosure includes a bonding layer 2 provided on a substrate 1 and an electronic component 3 provided on the bonding layer 2. In addition, a coating film 4 is formed, so as to cover a side of the bonding layer 2. Furthermore, as illustrated in FIG. 2, a bonding layer 12 may include a fillet extending laterally beyond a side edge of an electronic component 13, and when the bonding layer 12 includes a fillet, a coating film 14 is formed, so as to cover the fillet of the bonding layer 12.

Bonding Layer

The bonding layer is a layer for bonding the substrate and the electronic component and contains copper in an amount of greater than 0 mass % but 60 mass % or less, the copper having its crystal grain size of 50 nm or less. The bonding layer containing 0 mass % of copper having a crystal grain size of 50 nm or less may have poor sinterability. On the other hand, the bonding layer containing greater than 60 mass % of copper having a crystal grain size of 50 nm or less may reduce the sulfur resistance of the resulting electronic device. From such viewpoints, the bonding layer may contain from 5 to 55 mass % of copper having a crystal grain size of 50 nm or less.

The amount of the copper having a crystal grain size of 50 nm or less contained in the bonding layer can be adjusted by appropriately adjusting the firing temperature and the firing time of the bonding layer.

The amount of the copper having a crystal grain size of 50 nm or less contained in the bonding layer can be measured by electron backscatter diffraction (EBSD) and can be calculated from the resulting crystal grain size distribution, and can be specifically measured by a method described in Examples.

In addition, the bonding layer may contain copper having a crystal grain size of greater than 50 nm in an amount of 40 mass % or greater but less than 100 mass %, or from 45 to 95 mass %. With the bonding layer containing copper having a crystal grain size of greater than 50 nm in an amount within the above range, an electronic device having excellent sulfur resistance can be obtained. The upper limit of the crystal grain size of the copper may be 1000 nm or 500 nm.

The thickness of the bonding layer may be from 5 to 100 μm, from 10 to 80 μm, or from 30 to 50 μm from the viewpoints of bonding reliability and thermal resistance.

Coating Film

The coating film contains at least one compound selected from copper (I) oxide ($Cu_2O$) and copper (II) oxide (CuO). The coating film containing at least one compound selected from $Cu_2O$ and CuO prevents the penetration of sulfur into the bonding layer, and this can prevent the generation of copper sulfide.

When the coating film has a thickness of A nm, and a proportion of the copper (I) oxide ($Cu_2O$) content present in copper oxides contained in the coating film is B mass %, the following relationship (1) may be met for A and B from the viewpoint of increasing the sulfur resistance, and in addition, satisfying the relationship (2) below enables obtaining an electronic device having excellent resistance against a sulfur gas ($S_8$) test of which conditions are more stringent compared to a sulfur-based gas test:

$$A \geq 10, B \geq 20 \quad (1)$$

$$B \geq 1.15 \times A^{-0.2} \times 100 \quad (2)$$

The coating film with a thickness (in an average value) of 10 nm or greater prevents the penetration of sulfur into the bonding layer, and this can prevent the generation of copper sulfide. From such a viewpoint, the thickness of the coating film may be 30 nm or greater, or 50 nm or greater. On the other hand, from the viewpoint of thermal resistance, the upper limit of the thickness of the coating film may be 2000 nm, 1000 nm, or 500 nm.

The thickness of the coating film can be adjusted by appropriately adjusting the oxidation temperature and the oxidation time of the coating film.

The thickness of the coating film can be measured using a field emission scanning electron microscope (FE-SEM) and energy-dispersive X-ray analysis (EDX) and specifically can be measured by a method described in Examples.

When a proportion of the $Cu_2O$ content present in copper oxides contained in the coating film is 20 mass % or greater, the resulting electronic device can have improved sulfur resistance. From such a viewpoint, the proportion of the $Cu_2O$ content present in copper oxides contained in the coating film may be 25 mass % or greater, 60 mass % or greater, 75 mass % or greater, or 100 mass % or greater.

The proportion of the $Cu_2O$ content present in copper oxides contained in the coating film can be adjusted by appropriately adjusting the oxidation temperature and the oxidation time of the coating film.

The proportion of the copper (I) oxide ($Cu_2O$) content can be measured by an X-ray diffraction (XRD) apparatus and specifically can be measured by a method described in Examples.

The proportion of the copper (II) oxide (CuO) content present in copper oxides contained in the coating film may be from 0 to 80 mass %, from 0 to 75 mass %, from 0 to 40 mass %, or from 0 to 25 mass %.

The proportion of the copper (II) oxide (CuO) content can be measured by an X-ray diffraction (XRD) apparatus.

In addition, the total amount of copper oxides contained in the coating film may be from 40 to 100 mass %, from 60 to 100 mass %, or from 80 to 100 mass %.

Substrate

Examples of the substrate include substrates formed of a material, such as copper, copper-plated copper, a pre-plated leadframe (PPF), glass epoxy, ceramic, and the like.

Electronic Component

Examples of the electronic component include semiconductor elements, heat generating members, and heat radiating members.

Examples of the semiconductor element include optical semiconductor devices (light emitting elements), such as LEDs; transistors; and diodes; and the semiconductor element may be an optical semiconductor device.

The type of the optical semiconductor device is not particularly limited, and examples also include those in which a nitride semiconductor, such as InN, AlN, GaN, InGaN, AlGaN, or InGaAlN, is formed as a light-emitting layer on a substrate by an MOBVC method or the like.

The heat generating member may be the semiconductor element described above or a member including the semiconductor element, or may be a heat generating member other than that. Examples of the heat generating member other than the semiconductor element include optical pickups and power transistors. In addition, examples of the heat radiating member include heat sinks and heat spreaders.

The electronic device of the present disclosure has excellent sulfur resistance and thus is suitably used for automotive lamps, streetlights, and the like.

Method for Manufacturing Electronic Device

A method for manufacturing an electronic device according to the present disclosure includes:

firing a substrate including an electronic component disposed over a copper paste at 125 to 250° C. for 30 minutes to 10 hours in a reducing atmosphere, so as to bond the substrate and the electronic component through a bonding layer containing copper; and oxidizing a side of the bonding layer by heating the substrate at 150 to 250° C. for 3 minutes to 10 hours in an oxygen-containing atmosphere, so as to form a coating film containing at least one compound selected from copper (I) oxide ($Cu_2O$) and copper (II) oxide (CuO).

Firing Step

In the firing step, first, a copper paste is applied onto a substrate, and an electronic component is disposed over the copper paste.

For the substrate and the electronic component, those described above in the section of the electronic device can be used.

The copper paste can be any paste containing a copper paste and not particularly limited but may contain a copper particle, a copper particle of large particle size having a particle size greater than that of the copper particle, and an organic solvent.

Copper Particle

The average particle size of the copper particle may be from 1 to 1000 nm, from 20 to 800 nm, or from 30 to 500 nm from the viewpoint of the denseness in the bonding layer.

The average particle size of the copper particle is calculated as the average value for 10 copper particles (n=10) randomly selected based on an observation image with a scanning electron microscope (e.g., trade name: JSM-7600 F, available from JEOL Ltd.; SEM). The average value is an arithmetic mean value, and 10 or more copper particles may be used in the calculation.

Method for Manufacturing Copper Particle

The copper particle can be obtained, for example, by reducing a copper compound with a reducing compound in the presence of a carboxylic acid amine salt. Note that the copper compound, the carboxylic acid amine salt, and the reducing compound may be mixed in an organic solvent.

The heating temperature in the mixing is such a temperature that allows the copper compound to be pyrolyzed and reduced and a copper particle to be produced, and for example, it may be from 70 to 150° C. or from 80 to 120° C.

The copper compound is any compound containing a copper atom and is not particularly limited, and examples include copper carboxylate, copper oxide, copper hydroxide, and copper nitride. The copper compound may be copper carboxylate from the viewpoint of uniformity during the reaction. These may be used alone or in combination of two or more.

Examples of the copper carboxylate include copper carboxylic anhydrides or copper carboxylate hydrates of copper (I) formate, copper (I) acetate, copper (I) propionate, copper (I) butyrate, copper (I) valerate, copper (I) caproate, copper (I) caprylate, copper (I) caprate, copper (II) formate, copper (II) acetate, copper (II) propionate, copper (II) butyrate, copper (II) valerate, copper (II) caproate, copper (II) caprylate, copper (II) caprate, copper (II) citrate, or the like. The copper carboxylate may be copper (II) acetate monohydrate from the viewpoints of productivity and ease of availability. In addition, these may be used alone or in combination of two or more.

The carboxylic acid amine salt can be obtained from a carboxylic acid compound and an amine compound, those commercially available may be used, or those obtained by synthesis in advance may be used. Note that the carboxylic acid amine salt may be produced in situ by charging a carboxylic acid compound and an amine compound each separately into a reaction vessel during the manufacturing process of the copper particle.

The carboxylic acid amine salt is produced by blending a carboxylic acid compound and an amine compound in an equivalent amount of functional groups in an organic solvent and mixing at relatively mild temperature conditions of room temperature (25° C.) to approximately 100° C. The carboxylic acid amine salt may be taken out from the reaction solution containing the carboxylic acid amine salt by distillation, recrystallization, or the like.

The carboxylic acid compound constituting the carboxylic acid amine salt is any compound containing a carboxy group and is not particularly limited, and examples include monocarboxylic acids, dicarboxylic acids, aromatic carboxylic acids, and hydroxy acids. These may be used alone or in combination of two or more.

The amine compound constituting the carboxylic acid amine salt is any compound containing an amino group and is not particularly limited, and examples include alkylmonoamines, alkyldiamines, and alkanolamines. These may be used alone or in combination of two or more.

The reducing compound is any compound having a reducing power reducing the copper compound and releasing metallic copper and is not particularly limited.

Examples of the reducing compound typically include hydrazine derivatives. Examples of the hydrazine derivative include hydrazine monohydrate, methylhydrazine, ethylhydrazine, n-propylhydrazine, i-propylhydrazine, n-butylhydrazine, i-butylhydrazine, sec-butylhydrazine, t-butylhydrazine, n-pentylhydrazine, i-pentylhydrazine, neopentylhydrazine, t-pentylhydrazine, n-hexylhydrazine, i-hexylhydrazine, n-heptylhydrazine, n-octylhydrazine, n-nonylhydrazine, n-decylhydrazine, n-undecylhydrazine, n-dodecylhydrazine, cyclohexylhydrazine, phenylhydrazine, 4-methylphenylhydrazine, benzylhydrazine, 2-phenylethylhydrazine, 2-hydrazinoethanol, and acetohydrazine. These may be used alone or in combination of two or more.

For the organic solvent used in manufacturing the copper particle, any organic solvent not interfering with properties of a complex or the like produced from a mixture obtained by mixing each of the raw materials described above can be used without any particular limitation. For the organic solvent, an alcohol exhibiting compatibility with the reducing compound described above may be used.

Examples of the alcohol include 1-propanol, 2-propanol, butanol, pentanol, hexanol, heptanol, octanol, ethylene glycol, 1,3-propanediol, 1,2-propanediol, butyl carbitol, butyl carbitol acetate, ethyl carbitol, ethyl carbitol acetate, diethylene glycol diethyl ether, and Butyl CELLOSOLVE. These may be used alone or in combination of two or more.

The amount of the copper compound, the carboxylic acid amine salt, and the reducing compound to be used may be from 0.1 to 10 mol of the carboxylic acid amine salt and from 0.5 to 5 mol of the reducing compound relative to 1 mol of the copper compound, or from 1 to 5 mol of the carboxylic acid amine salt and from 0.5 to 3 mol of the reducing compound relative to 1 mol of the copper compound.

The organic solvent is used in such an amount for each of these components described above to be able to react sufficiently, and is used, for example, in an amount of approximately 50 to 2000 mL.

Copper Particle of Large Particle Size

For the copper particle of large particle size, its average particle size may be greater than 1 μm but 30 μm or less, or 1 to 20 μm. Note that the shape of such a particle is not particularly limited, and spherical, plate-shaped, flaky, scaly, dendritic, rod-shaped, or wire-shaped particle can be used.

The average particle size of the copper particle of large particle size can be measured using a laser diffraction scattering particle size distribution measurement apparatus or the like.

The copper particle of large particle size may be treated with a lubricant or rust inhibitor. A typical example of such treatment is treatment with a carboxylic acid compound. Examples of the carboxylic acid compound include formic acid, acetic acid, propionic acid, butyric acid, valeric acid, caproic acid, caprylic acid, octyl acid, nonanoic acid, capric acid, palmitic acid, oleic acid, stearic acid, isostearic acid, oxalic acid, malonic acid, succinic acid, glutaric acid, adipic acid, pimelic acid, suberic acid, azelaic acid, sebacic acid, diglycolic acid, benzoic acid, phthalic acid, isophthalic acid, terephthalic acid, salicylic acid, gallic acid, glycolic acid, lactic acid, tartronic acid, malic acid, glyceric acid, hydroxybutyric acid, tartaric acid, citric acid, and isocitric acid.

Organic Solvent

For the organic solvent, any known solvent functioning as a reducing agent can be used.

The organic solvent may be an alcohol, and examples include aliphatic polyhydric alcohols. Examples of the aliphatic polyhydric alcohol include glycols, such as ethylene glycol, diethylene glycol, propylene glycol, dipropylene glycol, 1,4-butanediol, glycerin, and polyethylene glycol. These organic solvents may be used alone or in combination of two or more.

When the organic solvent is blended, the blending amount may be from 7 to 20 parts by mass relative to 100 parts by mass of the copper particle. The organic solvent blended in an amount of 7 parts by mass or greater does not increase the viscosity of copper paste too much and can improve the workability, and the organic solvent blended in an amount of 20 parts by mass or less prevents reduction in the viscosity, and this prevents subsidence of copper in the paste and thus can increase the reliability.

In addition to each of these components described above, an additional component commonly blended to this type of composition can be blended in the copper paste as necessary within a range that does not inhibit the effects of the present disclosure. Examples of such an additional component include a thermosetting resin; a curing accelerator; a stress-reducing agent, such as rubber or silicone; a coupling agent; an antifoaming agent; a surfactant; a coloring agent, such as a pigment or a dye; a polymerization inhibitor of various types; or an antioxidant. Each of these components may be used alone, or two or more of them may be mixed together and used.

The copper paste can be prepared by thoroughly mixing the copper particle described above, and as necessary, the copper particle of large particle size, the organic solvent, and the like, and then kneading is performed using a dispersion, kneader, 3-roll mill, or the like, followed by defoaming.

Next, the substrate including an electronic component disposed over the copper paste is fired at 125 to 250° C. for 30 minutes to 10 hours in a reducing atmosphere, so as to bond the substrate and the electronic component through a bonding layer containing copper.

With a firing temperature lower than 125° C., bonding failure may occur, and a firing temperature exceeding 250° C. may damage an LED element. From such viewpoints, the firing temperature may be from 150 to 230° C. or from 180 to 210° C.

In addition, with a firing time shorter than 30 minutes, the content of the copper having a crystal grain size of 50 nm or less contained in the bonding layer may increase too much, and this may reduce the sulfur resistance of the resulting electronic device, and firing exceeding 10 hours may damage an LED element. From such viewpoints, the firing time may be from 1 to 4 hours or from 1 to 3 hours.

Examples of the reducing atmosphere include a hydrogen gas atmosphere; or a mixed gas atmosphere of inert gas, such as argon or nitrogen, and/or nitrogen gas and hydrogen gas, such as forming gas; and a formic acid atmosphere.

Oxidizing Step

In the oxidizing step, the substrate is heated at 150 to 250° C. for 3 minutes to 10 hours in an oxygen-containing atmosphere to oxidize a side of the bonding layer, so as to form a coating film containing at least one compound selected from copper (I) oxide ($Cu_2O$) and copper (II) oxide (CuO).

With a heating temperature (oxidation temperature) lower than 150° C., the coating film formation may be insufficient, and heating exceeding 250° C. may increase the proportion of copper (II) oxide in the coating film. From such viewpoints, the heating temperature may be from 180 to 230° C. or from 190 to 210° C.

In addition, with a heating time (oxidation time) shorter than 3 minutes, the coating film formation may be insufficient, and heating exceeding 10 hours may increase the proportion of copper (II) oxide in the coating film. From such viewpoints, the heating time may be from 0.25 to 4 hours or from 0.5 to 3 hours.

Examples of the oxygen-containing atmosphere include atmospheric atmosphere.

EXAMPLES

Next, the present disclosure will be specifically described with examples; however, the present disclosure is not limited in any way to these examples.

Preparation Example 1: Preparation of Carboxylic Acid Amine Salt

As the carboxylic acid compound, 40 mmol of nonanoic acid (trade name: Nonanoic Acid, available from Tokyo Chemical Industry Co., Ltd.), and as the amine compound, 40 mmol of hexylamine (trade name: Hexylamine, available from Tokyo Chemical Industry Co., Ltd.), were placed in a 50-mL sample bin, and stirred and mixed in an aluminum block heating stirrer; heat was generated up to 60° C. The mixture was subsequently stirred and mixed at 60° C. for 15 minutes and cooled to room temperature (25° C.), and a nonanoic acid hexylamine salt (yield of 10.3 g, 99.2%).

Synthesis Example 1: Synthesis of Copper Particle

As the copper compound, 20 mmol of copper (II) acetate monohydrate (trade name: Copper (II) Acetate Monohydrate, available from Tokyo Chemical Industry Co., Ltd.), as the carboxylic acid amine salt, 40 mmol of the nonanoic acid hexylamine salt obtained in Preparation Example 1, and as the organic solvent, 3 mL of Butyl Cellosolve (available from Tokyo Chemical Industry Co., Ltd.), were placed in a 50-mL sample bin, mixed in an aluminum block heating stirrer at 90° C. for 5 minutes, and a copper precursor solution was prepared. After the copper precursor solution was cooled to room temperature (25° C.), a solution prepared by dissolving 20 mmol of hydrazine monohydrate (trade name: Hydrazine Monohydrate, available from FUJI-FILM Wako Pure Chemical Corporation) as the reducing compound in 3 mL of 1-propanol was added to the copper precursor solution in the sample bin, and the mixture was stirred for 5 minutes.

The mixture was heated and stirred again in an aluminum block heating stirrer at 90° C. for 2 hours. After 5 minutes, 2 mL of ethanol (guaranteed reagent grade, available from Kanto Chemical Co., Inc.) was added, and a solid was obtained by centrifugation (4000 rpm (1 minute)). The centrifuged solid was dried under reduced pressure, and a copper particle (average particle size of 50 nm, yield of 0.31 g or 97.8%) having copper luster in a powder form was obtained.

The average particle size of the copper particle was calculated as the average value of 10 copper particles (n=10) randomly selected based on an observation image with a scanning electron microscope (trade name: JSM-7600 F, available from JEOL Ltd.; SEM).

Example 1

Each of these components having the type and blending amount as described in Table 1 was mixed and kneaded with a roll, and a bonding paste (copper paste) was obtained.

Next, the copper paste was applied onto a substrate (trade name: Aluminum Substrate for REGAL, available from Sozo Kagaku YK) to give a thickness after firing of 30 µm, and an electronic component (trade name: NVSW 119CT, available from Nichia Corporation) was disposed over the copper paste. Next, the substrate including the electronic component disposed over the copper paste was fired at 200° C. for 1 hour under a forming gas atmosphere, and the substrate and the electronic component were bonded via a bonding layer containing copper. Next, the substrate was heated at 250° C. for 5 minutes under atmospheric atmosphere, a side of the bonding layer was oxidized to form a coating film containing copper oxide, and an electronic device of Example 1 was obtained.

The resulting electronic device was observed with a scanning electron microscopy (trade name: JSM-7600F, available from JEOL Ltd.; SEM), and the bonding layer was confirmed to have a fillet extending laterally beyond a side edge of the electronic component, and the coating film was confirmed to be formed to cover the fillet.

Examples 2 to 7 and Comparative Examples 1 and 2

Each of the components of the type and blending amount described in Table 1 was mixed and kneaded with a roll, and a bonding paste of each of Examples and Comparative Examples was obtained. An electronic device of each of Examples and Comparative Examples was obtained using the resulting bonding paste by the method described in Example 1 except for changing to the firing temperature, firing time, heating temperature, and heating time described in Table 1.

Details of each component described in Table 1 used in preparing the bonding paste are as follows.

Copper particle: the copper particle obtained in Synthesis Example 1 (average particle size of 50 nm)

Silver particle: a spherical silver particle (trade name: MDot, available from Mitsuboshi Belting Ltd., average particle size of 50 nm)

Copper powder: Cu-HWQ (trade name, available from Fukuda Metal Foil & Powder Co., Ltd., average particle size of 1.5 µm)

Silver powder: AgC-212D (trade name, available from Fukuda Metal Foil & Powder Co., Ltd., average particle size of 5 µm)

Organic solvent: diethylene glycol, available from Tokyo Chemical Industry Co., Ltd.

The electronic device obtained in each of Examples and Comparative Examples was used to evaluate by the following methods. The results are shown in Table 1.

Method of Evaluating Electronic Device (1) Proportion of Copper Having Crystal Grain Size of 50 nm or Less Contained in Bonding Layer After embedding the electronic device with an epoxy resin, the cross section of the bonding layer was exposed by grinding, polishing, and CP processing, and the cross-section of the bonding layer was analyzed for particle size by electron backscatter diffraction using a field emission scanning microscope (trade name: SU5000, available from Hitachi High-Technologies Corporation), and a histogram of the crystal grain sizes was output. The proportion of the crystal grain size of 50 nm or less was calculated from the resulting histogram.

(2) Thickness of Coating Film

After embedding the electronic device with an epoxy resin, the cross section of the bonding layer was exposed by grinding, polishing, and CP processing, and the vicinity of the coating film was subjected to line analysis by energy-dispersive X-ray analysis using a field emission scanning microscope (trade name: SU5000, available from Hitachi High-Technologies Corporation), and the distance at which oxygen atoms were detected was determined as the coating film thickness.

(3) Proportion of Copper (I) Oxide Relative to Copper Oxide Contained in Coating Film The fillet portion of the electronic device was subjected to ultra-fine analysis with an X-ray diffraction apparatus (trade name: SmartLab SE, available from Rigaku Corporation), and the quantitative values for copper (I) oxide and copper (II) oxide were calculated by Rietveld refinement.

(4) Sulfurization Resistance Test A

In accordance with the four mixed gas test of JIS C 60068-2-60: 2018, the electronic device was treated at 40° C. and 90% Rh for 336 hours under a mixed gas ($H_2S$: 10 ppb, $NO_2$: 200 ppb, $Cl_2$: 10 ppb; $SO_2$: 100 ppb), then the forward voltage (Vf) was measured, the rate of change (rate of increase) from the initial value was determined, and evaluated according to the following criteria.

A: The rate of increase of Vf was lower than 10%
B: The rate of increase of Vf was 10% or higher but lower than 20%
C: The rate of increase of Vf was 20% or higher (5) Sulfurization Resistance Test B The electronic device was placed in a glass container containing 1 g of sulfur powder, the glass container was immersed in an oil bath at 100° C. and held for 900 hours, then the forward voltage (Vf) was measured, the rate of change (rate of increase) from the initial value was determined, and evaluated according to the following criteria.

A: The rate of increase of Vf was lower than 10%
B: The rate of increase of Vf was 10% or higher but lower than 20%
C: The rate of increase of Vf was 20% or higher

TABLE 1

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
| Bonding paste | Copper particle (parts by mass) | 60 | 60 | 60 | 60 | 60 | 60 | 60 | 60 | — |
|  | Silver particle (parts by mass) | — | — | — | — | — | — | — | — | 60 |
|  | Copper powder (parts by mass) | 40 | 40 | 40 | 40 | 40 | 40 | 40 | 40 | — |
|  | Silver powder (parts by mass) | — | — | — | — | — | — | — | — | 40 |
|  | Organic solvent (parts by mass) | 15 | 15 | 15 | 15 | 15 | 15 | 15 | 15 | 15 |
| Firing step | Firing temperature | 200° C. | 200° C. | 200° C. | 200° C. | 200° C. | 200° C. | 200° C. | 200° C. | 200° C. |
|  | Firing time | 1 h | 1 h | 1 h | 1 h | 1 h | 1 h | 2 h | 10 min | 1 h |
| Oxidizing step | Heating temperature | 250° C. | 250° C. | 200° C. | 200° C. | 225° C. | 200° C. | 200° C. | 200° C. | — |
|  | Heating time | 5 min | 30 min | 1 h | 4 h | 30 min | 3 h | 1 h | 1 h | — |
| Bonding layer | Bonding layer thickness (μm) | 30 | 30 | 30 | 30 | 30 | 30 | 30 | 30 | 30 |
|  | Proportion of copper having crystal grain size of 50 nm or less contained in bonding layer (mass %) | 50 | 50 | 50 | 50 | 50 | 50 | 26 | 70 | 0 |
| Coating film | Coating film thickness (nm) | 10 | 100 | 100 | 400 | 75 | 300 | 180 | 100 | — |
|  | Proportion of copper (I) oxide relative to copperoxide contained in coating film (mass %) | 30 | 20 | 80 | 30 | 54 | 45 | 55 | 80 | — |
| Evaluation | Sulfurization resistance test A | A | A | A | A | A | A | A | B | C |
|  | Sulfurization resistance test B | B | B | A | B | A | A | A | C | C |

The electronic devices of Examples 1 to 7, in which the proportion of copper having a crystal particle size of 50 nm or less contained in the bonding layer was 60 mass % or less, Examples 1 to 7 including the coating film containing copper oxide covering a side of the bonding layer, all showed a rate of increase of Vf that was lower than 10% in the sulfurization resistance test A and a rate of increase of Vf that was lower than 20% in the sulfurization resistance test B, indicating excellent sulfur resistance. On the other hand, the electronic device of Comparative Example 1, in which the proportion of copper having a crystal particle size of 50 nm or less contained in the bonding layer was 70 mass %, showed a rate of increase of Vf that was lower than 20% in the sulfurization resistance test A but a high rate of increase of Vf that was 20% or higher in the sulfurization resistance test B, indicating poor sulfur resistance compared to Examples. Note that the electronic device of Comparative Example 2, in which a silver paste was used as the bonding paste, showed a high rate of increase of Vf that was 20% or higher both in the sulfur resistant test A and the sulfur resistant test B, indicating poor sulfur resistance compared to Examples.

REFERENCE SIGNS LIST 10, 20 Electronic device
1, 11 Substrate
2, 12 Bonding layer
3, 13 Electronic component
4, 14 Coating film

The invention claimed is:

1. An electronic device comprising:
   a substrate;
   a bonding layer provided on the substrate, the bonding layer containing copper in an amount of greater than 0 mass % but 60 mass % or less, the copper having its crystal grain size of 50 nm or less;
   an electronic component provided on the bonding layer; and
   a coating film covering a side of the bonding layer, the coating film containing at least one compound selected from copper (I) oxide ($Cu_2O$) and copper (II) oxide (CuO).

2. The electronic device according to claim 1,
   wherein the bonding layer comprises a fillet extending laterally beyond a side edge of the electronic component, and
   wherein the coating film covers the fillet.

3. The electronic device according to claim 1, wherein, when the coating film has a thickness of A nm and a proportion of the copper (I) oxide (Cu2O) content present in copper oxides contained in the coating film is B mass %, Relationship (1) is found for A and B:

$$10 \leq A \leq 2000, B \geq 20 \tag{1}$$

4. The electronic device according to claim 3, wherein, when the coating film has a thickness of A nm and a proportion of the copper (I) oxide ($Cu_2O$) content present in copper oxides contained in the coating film is B mass %, Relationship (2) is found for A and B:

$$B \geq 1.15 \times A^{-0.2} \times 100 \tag{2}$$

5. The electronic device according to claim 1, wherein the electronic component is an optical semiconductor device.

6. An automotive lamp comprising the electronic device described in claim 1.

7. A streetlight comprising the electronic device described in claim 1.

8. A method for manufacturing an electronic device, the method comprising:
   firing a substrate including an electronic component disposed over a copper paste at 125 to 250° C. for 30 minutes to 10 hours in a reducing atmosphere, so as to bond the substrate and the electronic component through a bonding layer containing copper; and
   oxidizing a side of the bonding layer by heating the substrate at 150 to 250° C. for 3 minutes to 10 hours in an oxygen-containing atmosphere, so as to form a coating film containing at least one compound selected from copper (I) oxide ($Cu_2O$) and copper (II) oxide (CuO).

* * * * *